United States Patent
Kanegae

(10) Patent No.: US 7,215,566 B2
(45) Date of Patent: May 8, 2007

(54) MAGNETRORESISTIVE RANDOM ACCESS MEMORY AND METHOD OF MANUFACTURING THE SAME

(75) Inventor: Yoshiharu Kanegae, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/214,869

(22) Filed: Aug. 31, 2005

(65) Prior Publication Data

US 2006/0114714 A1     Jun. 1, 2006

(30) Foreign Application Priority Data

Nov. 29, 2004   (JP) ............................. 2004-343274

(51) Int. Cl.
   *G11C 11/22* (2006.01)
(52) U.S. Cl. ...................... 365/145; 365/171
(58) Field of Classification Search ............... 365/145, 365/171; 360/324.12
   See application file for complete search history.

(56) References Cited

U.S. PATENT DOCUMENTS

| | | | | |
|---|---|---|---|---|
| 6,387,476 B1 * | 5/2002 | Iwasaki et al. | ............. | 428/212 |
| 6,545,848 B1 * | 4/2003 | Terunuma | ............. | 360/324.12 |
| 7,029,771 B2 * | 4/2006 | Hasegawa et al. | ....... | 428/811.5 |
| 2004/0180531 A1 | 9/2004 | Horikoshi | | |

OTHER PUBLICATIONS

M. Julliere; Physics Letters; Tunneling Between Ferromagnetic; 54A; 225; 1975.
Koichiro Inomata; Applied Physics 69; 186 : Japanese Society of Applied Physics; 2000.
M. Cerny, et al; Physical Review; B 67; 035116; The American Physical Society; 2003.

* cited by examiner

*Primary Examiner*—Vu A. Le
(74) *Attorney, Agent, or Firm*—Antonelli, Terry, Stout & Kraus, LLP.

(57) ABSTRACT

A magnetic memory includes a TMR element in its memory layer, wherein the TMR element in the memory layer has ferromagnetic layers which are kept in tensile strain, the ferromagnetic layers having either Fe, Co or Ni, and a wiring layer adjacent to each of the ferromagnetic layers includes either Ru, W, Ir, Os or Mo, thereby increasing the magnetization.

2 Claims, 12 Drawing Sheets

MAGNETORESISTIVE RANDOM ACCESS MEMORY AND METHOD OF MANUFACTURING THE SAME

BACKGROUND OF THE INVENTION

The present invention relates to a magnetoresistive random access memory (MRAM).

A magnetoresistive random access memory (MRAM) is expected to be a next-generation high performance memory which will substitute for DRAM and flash memory because of high speed, low power consumption, extremely high non-volatility, and rewrite resistance exhibited thereby, so that many foreign and national companies have studied and developed MRAM for practical use. The MRAM is generally a memory which makes use of the tunnel magnetoresistance (TMR) effect, and since the TMR ratio must be improved for accomplishing higher speed and higher reliability, investigations are extensively under progress for the material composition, deposition method, and the like which could result in a higher TMR ratio.

A TMR element as illustrated in FIG. 1 is used for a memory unit of MRAM. This element has a structure of sandwiching an insulating layer, called a "tunnel barrier layer," between ferromagnetic layers. As a voltage is applied to this element in the interlayer direction, a current flows due to the tunneling effect, wherein the value of the electric resistance differs depending on the magnetization directions of the two ferromagnetic layers. Generally, the resistance is smaller when the magnetization directions of the two ferromagnetic layers are parallel than when they are antiparallel. The MRAM utilizes this difference in resistance as bit information. Also, the ratio of the differences in resistance when the magnetization directions of the two ferromagnetic layers are parallel to when they are antiparallel is called the "TMR ratio." Assuming that the spin of electron is preserved during tunneling, the TMR ratio (R) is expressed by the following equation (M. Julliere: Physics Letters 54A, 225 (1975)):

$$R = 2P_1 \cdot P_2 / (1 - P_1 \cdot P_2) \quad (1)$$

where P1, P2 are spin polarizabilities of the respective ferromagnetic layers ($0 < P_1, P_2 < 1$). Thus, the polarizabilities $P_1$, $P_2$ should be increased in order to achieve a high TMR ratio. While sufficient understanding has not been acquired at present about factors which determines the polarizability P, the use of a magnetic material having larger magnetization (or magnetic moment) is deemed as a guideline for achieving a higher TMR ratio (Kouichiro Inomata, Applied Physics 69, 186 (2000), Japanese Society of Applied Physics).

On the other hand, the magnetic film may be made of Fe, Co, Ni or an alloy thereof, and it has been theoretically predicted that the magnetic moments of these materials vary due to strain applied thereto (Cerny et al., Physical Review B67, 035116 (2003)).

BRIEF SUMMARY OF THE INVENTION

It is an object of the present invention to increase the TMR ratio by controlling the strain applied to magnetic films which form part of a TMR element.

The present inventor investigated the dependence of the magnetic moment of Fe on strain. FIG. 2 shows the result of the investigation. On the horizontal axis of FIG. 2, a positive value represents tensile strain, while a negative value represents compression strain. It can be seen in FIG. 2 that the magnetic moment of Fe increases with tensile strain and decreases with compressive strain. Similar tendencies were found for Co and Ni. As a consequence, the inventors found that the TMR ratio would be increased by using these materials for magnetic films of a TMR element, and keeping the magnetic films in tensile strain. The present invention provides a MRAM having a TMR element which includes ferromagnetic films that are kept in tensile strain.

According to the present invention, the ferromagnetic layers of the MRAM are kept in tensile strain, so that the magnetization of the ferromagnetic layers is larger than those without strain or those kept in compression strain. Thus, the present invention can provide an MRAM whose TMR ratio is increased, and achieves higher speeds and higher reliability.

Other objects, features and advantages of the invention will become apparent from the following description of the embodiments of the invention taken in conjunction with the accompanying drawings.

DETAILED DESCRIPTION OF THE INVENTION

In the following, several embodiments of the present invention will be described in detail with reference to FIGS. 3 to 23.

FIRST EMBODIMENT

Figure 1:
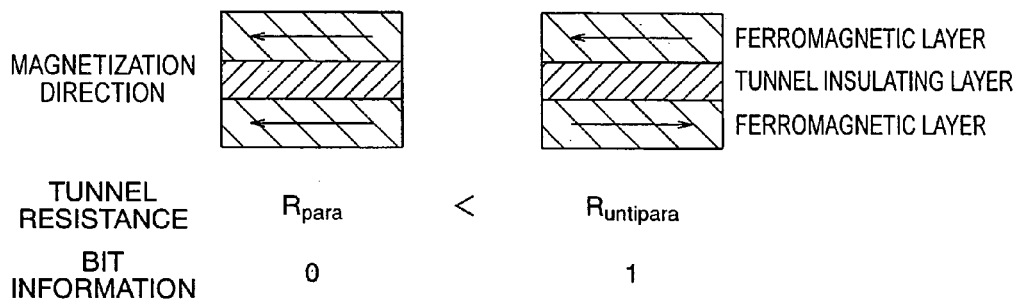
FIG. 1 is a cross-sectional view of a TMR element for describing the principle of MRAM.
Figure 2:
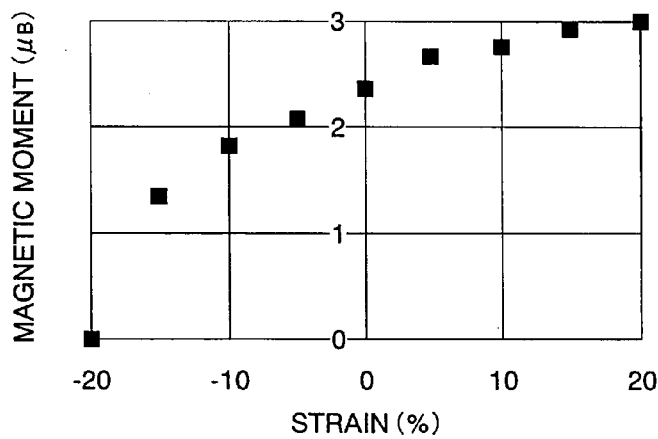
FIG. 2 is a graph representing the strain dependence of the magnetic moment of Fe.
Figure 3:
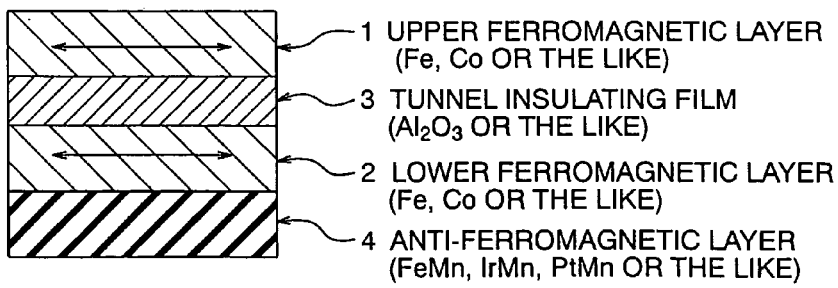
FIG. 3 is a cross-sectional view of a TMR element according to a first embodiment of the present invention.

FIG. 3 is a cross-sectional view of a TMR element according to a first embodiment of the present invention.

The TMR element of this embodiment comprises an upper ferromagnetic layer 1, a lower ferromagnetic layer 2, a tunnel insulating layer 3, and anti-ferromagnetic layer 4. The upper ferromagnetic layer 1 and lower ferromagnetic layer 2 are made of Fe, Co, Ni, an alloy thereof or the like. The tunnel insulating film 3 is made of $Al_2O_3$, MgO or the like, and the anti-ferromagnetic layer 4 is made of FeMn, IrMn, PtMn or the like. FIG. 3 illustrates a structure, called "spin-valve type" which is generally employed in the TMR element of MRAM, wherein the anti-ferromagnetic layer 4 acts to pin the magnetization direction of the lower ferromagnetic layer 2, and is called a "pinning layer." The upper and lower ferromagnetic layers 1, 2 are called a "free layer" and a "pinned layer," respectively, and the magnetization direction of the free layer alone is changed when data is stored in the TMR element. The ferromagnetic layer 1 or 2 is kept in tensile strain. Alternatively, both the ferromagnetic layers 1, 2 are kept in tensile strain. In this way, the TMR ratio of the TMR element is expected to increase as compared with the ferromagnetic layers 1, 2 which are not in strain or are kept in compression strain.

Figure 4:
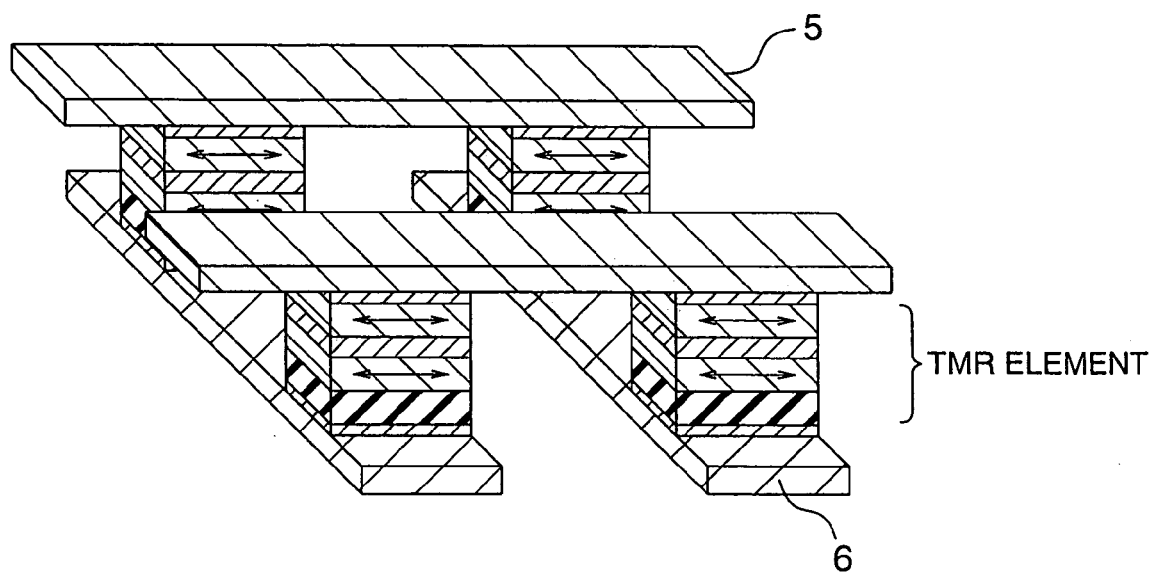
FIG. 4 is a perspective view illustrating the structure of an array in an MRAM in the first embodiment.
Figure 5:
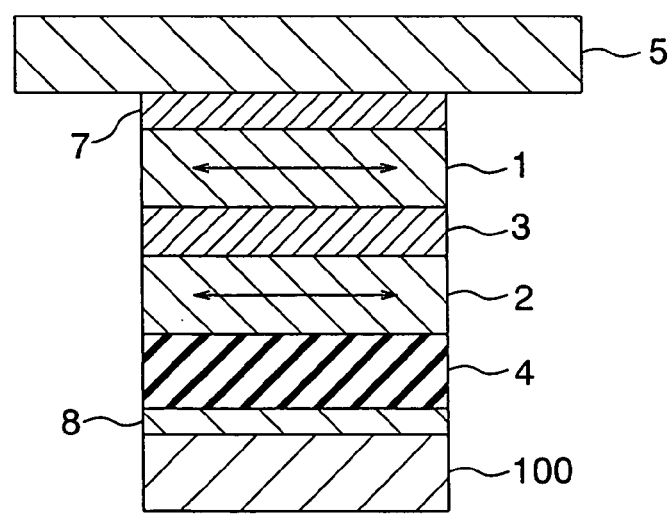
FIG. 5 is a cross-sectional view illustrating the TMR element and its surroundings of the MRAM in the first embodiment.

FIG. 4 illustrates the structure of an array in the MRAM according to the first embodiment of the present invention. Generally, the MRAM has a TMR element at each intersection of the upper wiring layers 5 and lower wiring layers 6 arranged in a lattice shape as illustrated in FIG. 4. Also, FIG. 5 illustrates a cross-sectional view of a TMR element and its surroundings. While a multi-layer film which constitutes the MRAM is formed of thin films by sputtering, CVD or the like, the close-packed plane generally appears on the surface in thin films. Therefore, for keeping the upper ferromagnetic layer of the TMR element in tensile strain, the upper wiring layer 5, which is in contact with the upper ferromagnetic layer 1, may be made of a material which has a larger interatomic distance on the close-packed plane and a larger Young's modulus than the material of the upper ferromagnetic layer. Also, for keeping the ferromagnetic layer in tensile strain, the upper wiring layer is preferably kept in compression strain. Therefore, the upper wiring layer is preferably deposited by sputtering such that the upper wiring layer is constituted of close-packed atoms.

Materials which have a larger interatomic distance on the close-packed plane and a larger Young's modulus than Fe, Co, Ni which can constitute the ferromagnetic layers, and which can be used for wiring materials, may be Ru, W, Ir, Os, Mo, and the like. Among these materials, Os, W exhibit large interatomic distances on the close-packed plane, while Ir, Os exhibit larger Young's modulus. Also, Ir, W, Mo exhibit low resistances.

The upper wiring layer preferably has a barrier metal 7 made of TiN, TaN, $RuO_2$ or the like, in order to suppress mutual diffusion between the upper wiring layer and ferromagnetic layer, enhance a peel strength and a migration resistance, and reduce an interface resistance for higher speeds. While the barrier metal may be deposited by sputtering, CVD or the like, the volume of the barrier metal is preferably expanded by nitridation or oxidization after Ti, Ta, Ru or the like is deposited by sputtering, in order to bring the ferromagnetic layer into tensile strain. When the ferromagnetic layer can be kept in tensile strain by employing the barrier metal, Al, Cu, Ag, Au or the like may be used as the material for the upper wiring layer. These wiring materials are low in resistance and contribute much to higher speeds of devices, though they have small Young's modulus.

$Al_2O_3$, MgO and the like, which can be materials for the tunnel insulating film 3, are generally in amorphous structure, so that they contribute to keep the ferromagnetic layer in tensile strain because they have larger interatomic distances on the interface than the interatomic distance on the close-packed plane of the ferromagnetic layer, and larger Young's modulus than that of the ferromagnetic layer. While the tunnel insulating film is deposited by the sputtering, CVD or the like, the tunnel insulating film is preferably deposited by the sputtering of $Al_2O_3$, MgO or the like or oxidized after Al, Mg or the like has been deposited by the sputtering, in order to bring the ferromagnetic layer into tensile strain.

Similarly, the anti-ferromagnetic layer 4 is preferably made of a material, such as IrMn, which has a lager interatomic distance on the interface and a larger Young's modulus than the ferromagnetic layers, and is deposited by the sputtering. Also, a barrier metal 8 such as TiN, TaN, $RuO_2$, is preferably disposed between a thin film layer 100 and the anti-ferromagnetic layer 4 in order to suppress mutual diffusion on the interface between the thin film layer 100 below the TMR element and the anti-ferromagnetic layer 4, enhance the peel strength and migration resistance, and increase the speed.

While this embodiment has been described in connection with the spin-valve type TMR element, the same is true with a double-junction type TMR element which has double tunnel junctions.

While it is understood that the magnetic moment of a magnetic material increases as the tensile strain is larger, excessively large strain is not necessarily preferable when factors other than the TMR ratio are taken into consideration. For example, excessively large strain could cause films to peel off on the interface, so that the lattice strain on the interface is preferably limited to approximately seven percent (7%) or less in consideration of the peel strength.

Next, a description will be given of a memory cell of the MRAM in this embodiment. While a tunnel current is generally read by a MOS transistor, a diode or the like, the memory cell of the MRAM described below is of a type which reads the tunnel current by a MOS transistor.

Figure 6:
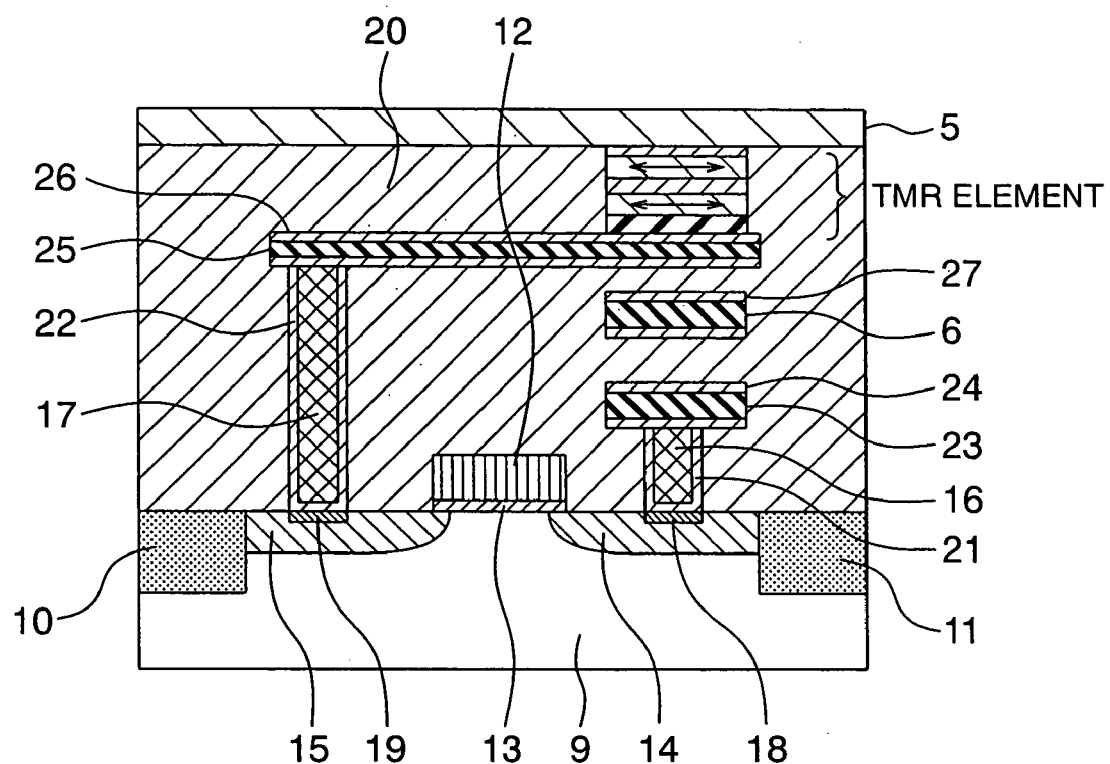
FIG. 6 is a cross-sectional view illustrating a memory cell of the MRAM in the first embodiment.

FIG. 6 is a cross-sectional view illustrating the memory cell of the MRAM in this embodiment. Element separation layers 10, 11 are formed on a P-type silicon substrate 9, and an N-channel MOS (NMOS) transistor is formed in an element formation region. The NMOS has a gate electrode 12, and a gate insulating film 13. The gate insulating film 13 may be made of such materials as $SiO_2$, SiON or a metal oxide having a high dielectric constant such as $HfO_2$, $ZrO_2$ or a metal silicate having a high dielectric constant such as HfSiO, ZrSiO, HfSiON, ZrSiON. The gate electrode 12 in turn is made, for example, of a polycrystalline silicon film, a metal thin film, a metal silicite film or a laminate thereof. Particularly, in consideration of suppression of mutual diffusion on the interface with the gate insulating film, and reduction in the resistance of the gate electrode for higher speeds, a preferred structure may employ a thin barrier metal made of TiN, TaN or the like, which exhibits a high adhesivity, on the gate insulating film, and employ a metal thin film made of W, Mo, Ta, Ti or the like on the barrier metal. In this structure, W or Mo should be employed if prime importance is placed on the reduction in resistance. Further, in regard to the two elements, W is refractory and excels in thermal stability, while Mo excels in film flatness. On the other hand, when prime importance is placed on the adhesivity with the barrier metal, Ti should be placed on TiN or Ta is placed on TaN in the structure used for the memory cell.

Contact plugs 16, 17, made of W, Al, poly-Si (polycrystalline silicon) or the like are connected to source/drain diffusion layers 14, 15 of the NMOS, respectively. In this structure, the contact plugs are preferably formed after contact layers 18, 19 have been formed on the interface of a contact region and barrier metals 21, 22 have been formed on the interface between the top surfaces of the contact layers 18, 19 and the interlayer insulating layer 20, in order to ensure a certain adhesivity with the interface of the silicon substrate and to prevent the mutual diffusion and peeling on the interface. The contact layers 18, 19 may be made of cobalt silicide ($CoSi_2$), titanium silicide ($TiSi_2$) or the like, while the barrier metals 21, 22 may be made of TiN, TaN or the like.

While the contact plug 16 is connected to a source line 23 made of Al, Cu or the like, the source line 23 preferably has a barrier metals 24, made of TiN, TaN or the like, on and below the source line 23 in order to prevent the mutual diffusion and peeling on the interface. The contact plug 17 is connected to an intermediate wiring layer 25 made of Al, Cu or the like, while the intermediate wiring layer 25 is connected to the bottom of the TMR element. Note that the intermediate wiring layer 25 preferably has barrier metals 26, made of Al, Cu or the like, as well in order to prevent the mutual diffusion and peeling on the interface. The memory cell also comprises an upper wiring layer 5 made of Ru, W, Ir, Os, Mo or the like on the TMR element; and a lower wiring layer 6 made of Al, Cu or the like and having barrier metals 27 below the TMR element across the interlayer insulating layer 20, where the lower wiring layer 6 is not directly connected to the TMR element. The spin-flip of the upper ferromagnetic layer is performed by applying currents to the upper and lower wiring layers 5, 6.

Figure 7:
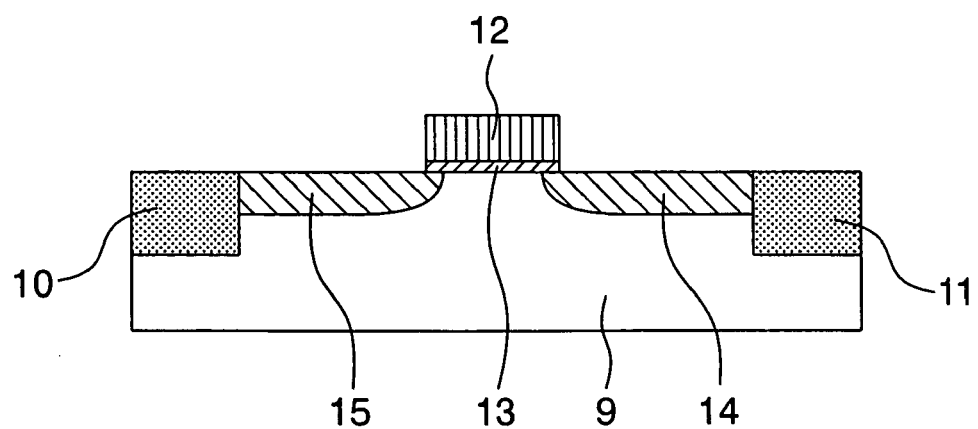
FIGS. 7 to 15 are diagrams for describing a method of manufacturing the MRAM in the first embodiment.
Figure 8:
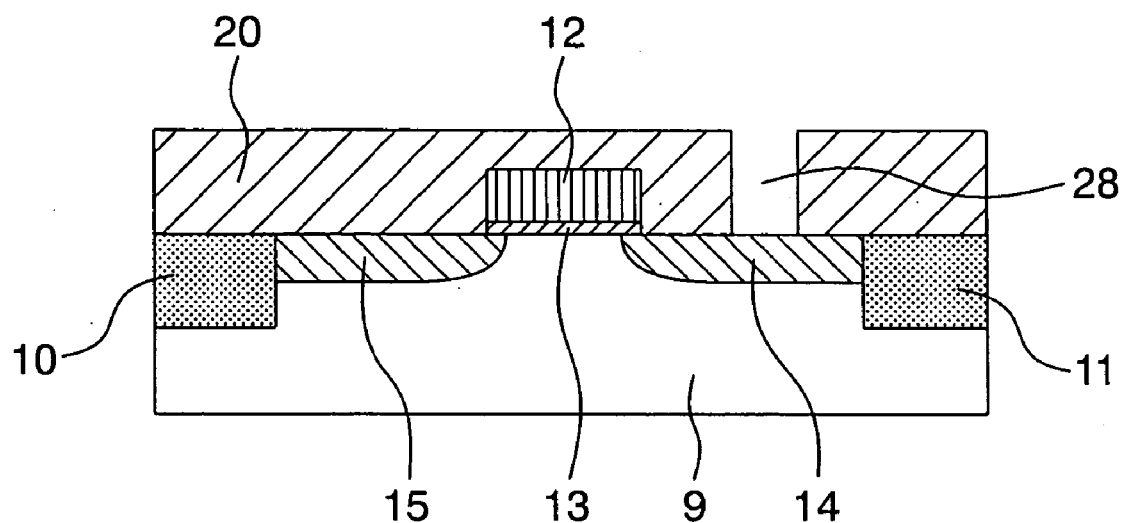
Figure 9:
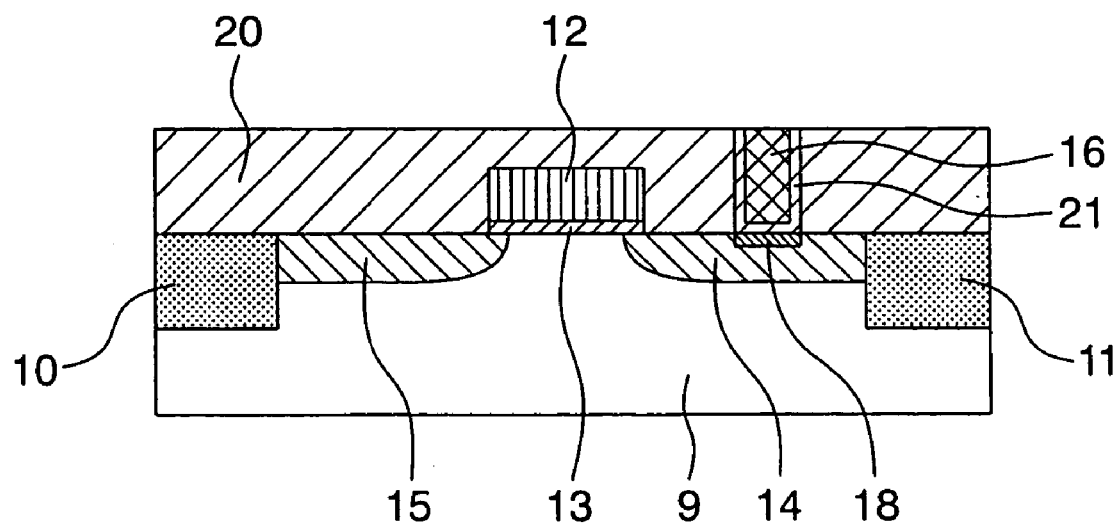
Figure 10:
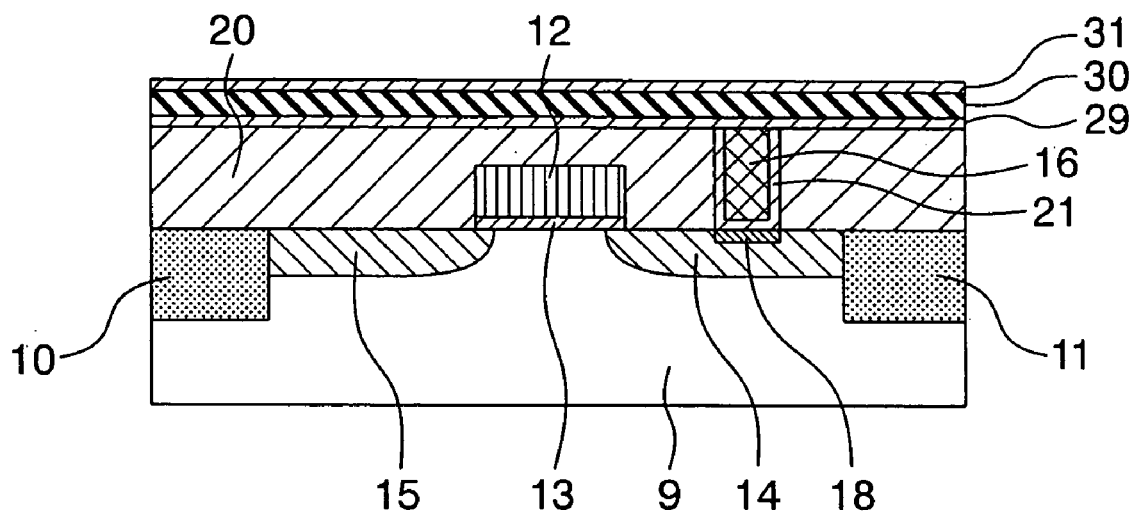
Figure 11:
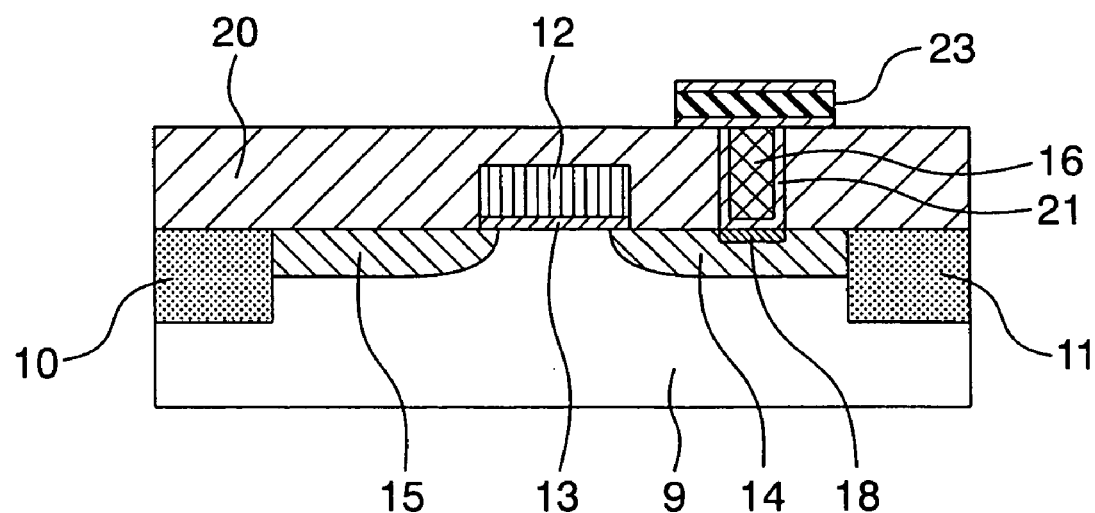
Figure 12:
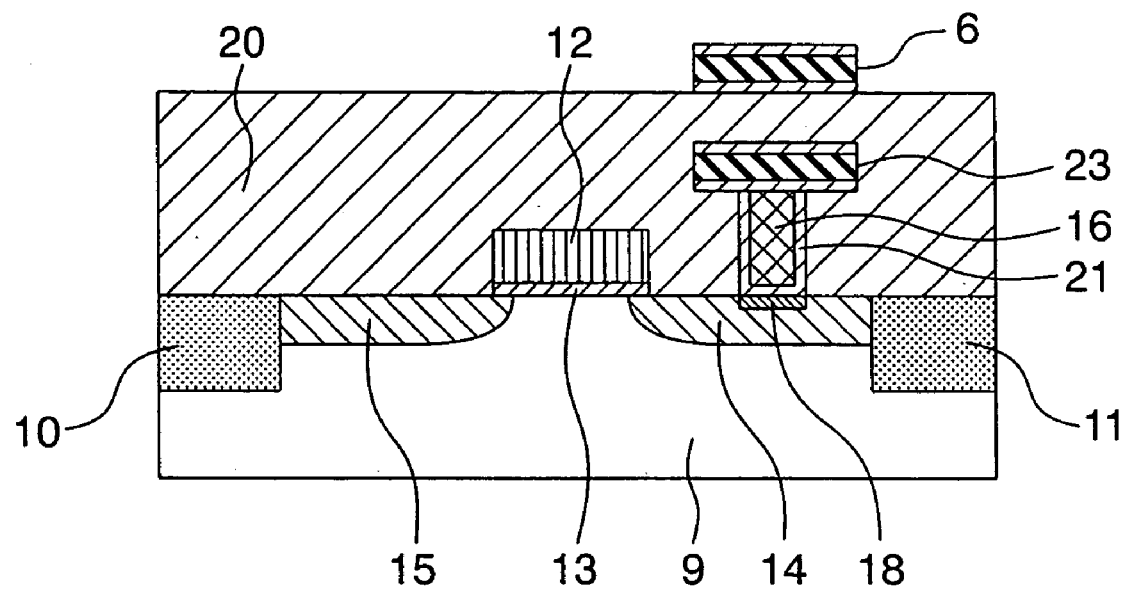
Figure 13:
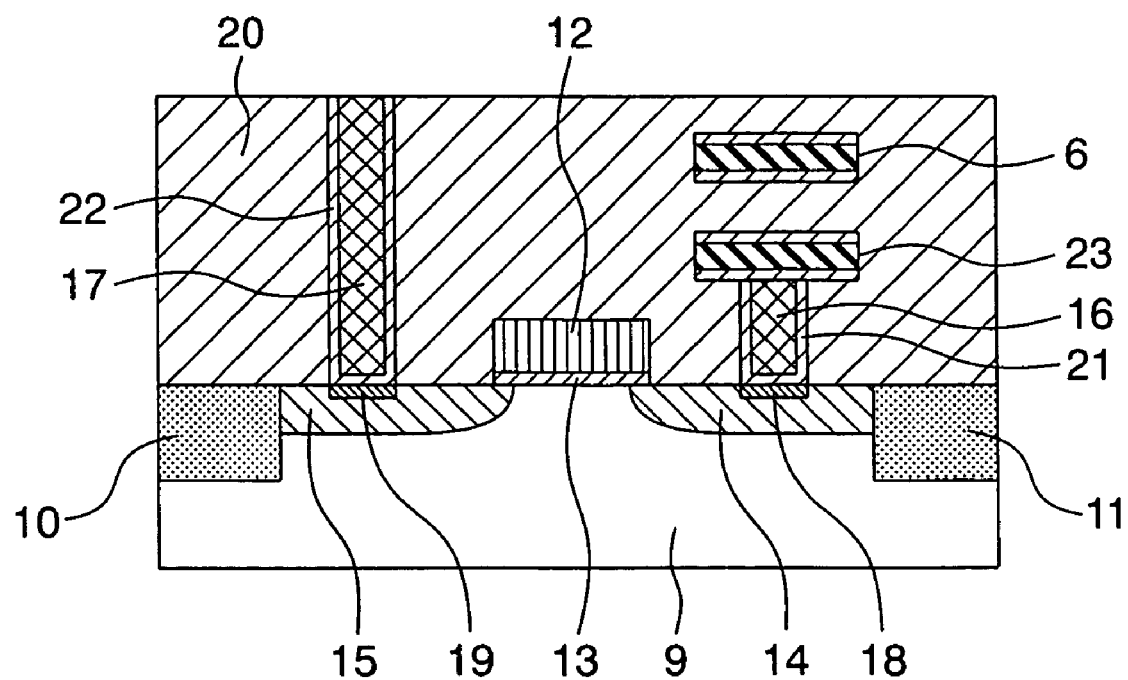
Figure 14:
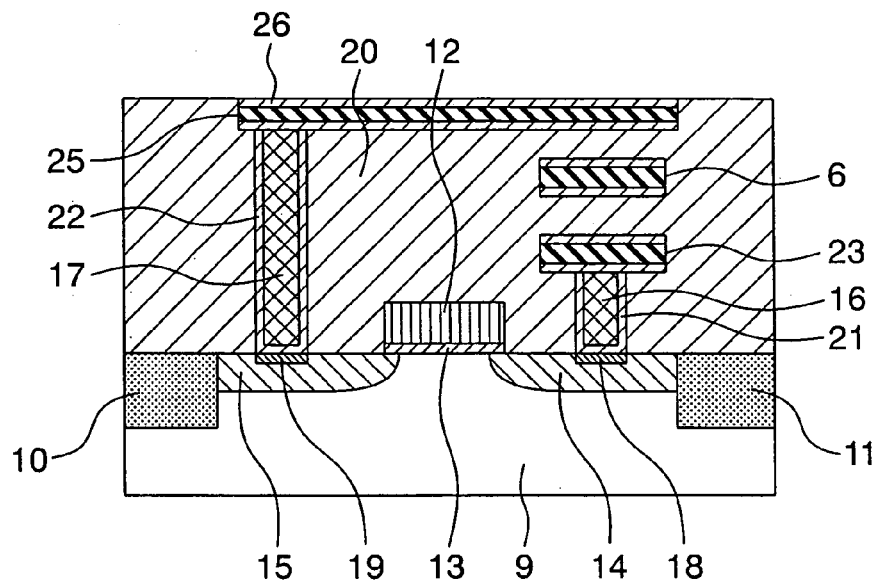
Figure 15:
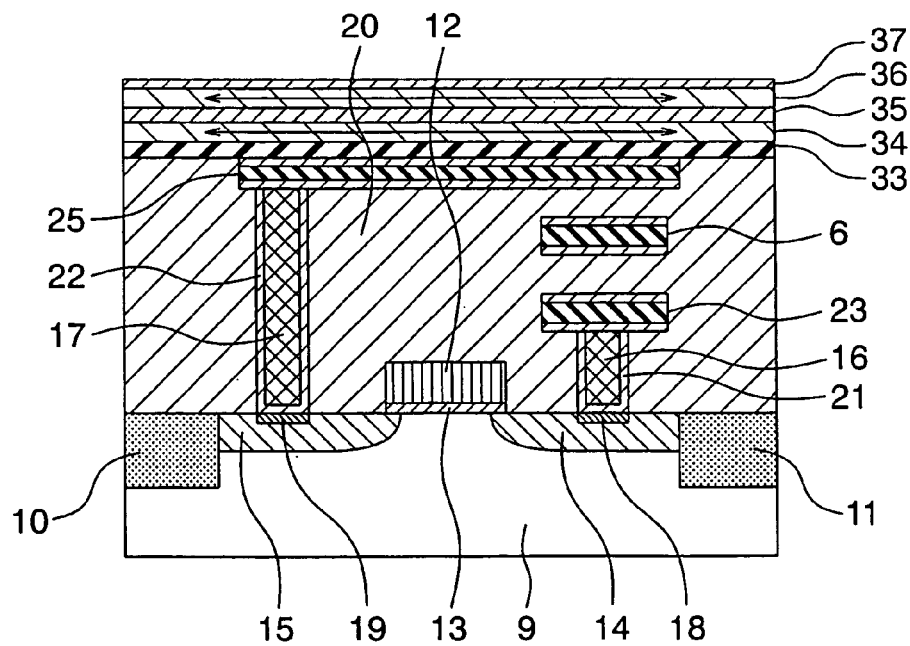

Next, a description will be given of a method of manufacturing the memory cell of the MRAM according to this embodiment. First, element separation regions 10, 11 and an NMOS are formed on a P-type silicon substrate 9 by a normal silicon process (FIG. 7). Next, after an interlayer insulating layer 20 is deposited by CVD, a contact hole 28 is formed to reach a source diffusion layer 14 by etching (FIG. 8). Subsequently, cobalt (Co), titanium (Ti) or the like is deposited in the opening of the contact hole 28 by sputtering or the like, and thermally treated to form a contact layer 18 made of $CoSi_2$, $TiSi_2$ or the like in a portion which is in contact with Si. Subsequently, Co, Ti or the like is removed from a portion in contact with the interlayer insulating layer, a barrier metal 21 made of TiN, TaN or the like is formed by the sputtering, a contact plug 16 is then formed by the sputtering, and the resulting product is finally planarized by CMP to produce a structure as illustrated in FIG. 9. Next, a barrier metal 29 made of TiN, TaN or the like, a wiring layer 30 made of Al, Cu or the like, and a barrier metal 31 made of TiN, TaN or the like are deposited by the sputtering (FIG. 10), followed by CMP-based planarization. Then, the structure is processed by the etching, as illustrated in FIG. 11, thereby forming a source line 23. Subsequently, an interlayer insulating layer 20 is further deposited, and a lower wiring layer 6 is formed by a process similar to the formation of the source line, as illustrated in FIG. 12. The lower wiring layer 6 is made of a material such as Al, Cu or the like. Subsequently, an interlayer insulating layer 20 is further deposited, and a contact hole is formed to reach the drain diffusion layer 15 by the etching, and a contact plug 17 is formed by a process similar to that used to form the contact plug 16, resulting in the structure as illustrated in FIG. 13. Next, an intermediate wiring layer 25 is formed by a process similar to that used to form the source line 23, followed by deposition of an interlayer insulating layer, CMP-based planarization, resulting in the structure as illustrated in FIG. 14. In this event, the intermediate wiring layer 25 preferably has barrier metals 26 made of TiN, TaN or the like, on and below the intermediate wiring layer 25, in order to prevent the mutual diffusion and peeling on the interface. Subsequently, an anti-ferromagnetic layer 33, a lower ferromagnetic layer 34, a tunnel insulating layer 35, and an upper ferromagnetic layer 36 are deposited to form a TMR element, and a barrier metal 37 is further deposited (FIG. 15). In this event, for bringing the upper and lower ferromagnetic layers 34, 36 into tensile strain, the anti-ferromagnetic layer 33 is preferably made of a material which has an interatomic distance on the interface and a larger Young's modulus than the lower ferromagnetic layer, such as IrMn, and deposited by sputtering, and the tunnel insulating layer is preferably made by sputtering $Al_2O_3$, MgO or the like or sputtering Al, Mg or the like and oxidizing the material. Also, in the deposition of the barrier metal 37, Ti, Ta, Ru or the like is preferably deposited by sputtering, and nitrided or oxidized to expand the volume of the barrier metal. Subsequently, the TMR element is processed by etching, an interlayer insulating layer is deposited and planarized, and then an upper wiring layer 5 is deposited and planarized, resulting in the formation of the memory cell of the MRAM illustrated in FIG. 6. In this event, however, the upper wiring layer 5 is preferably deposited by sputtering Ru, W, Ir, Os, Mo or the like. Through the foregoing process, the MRAM is manufactured with the TMR element which has the upper and lower ferromagnetic layers kept in tensile strain.

SECOND EMBODIMENT

Figure 16:
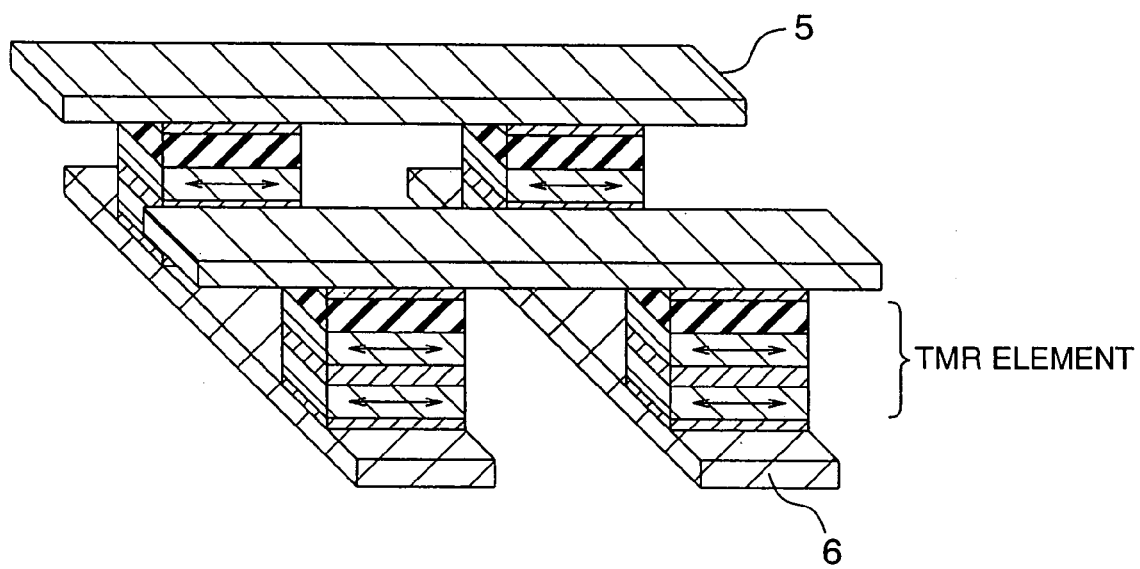
FIG. 16 is a perspective view illustrating the structure of an array in an MRAM according to a second embodiment.
Figure 17:
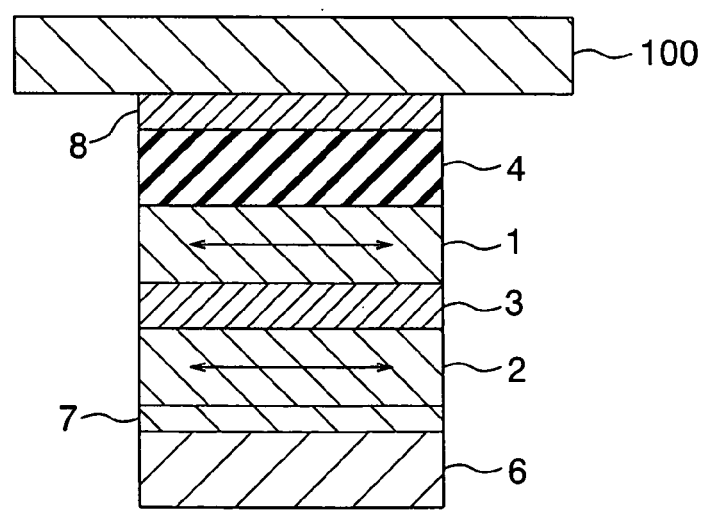
FIG. 17 is a cross-sectional view illustrating the TMR element and its surroundings of the MRAM in the second embodiment.
Figure 18:
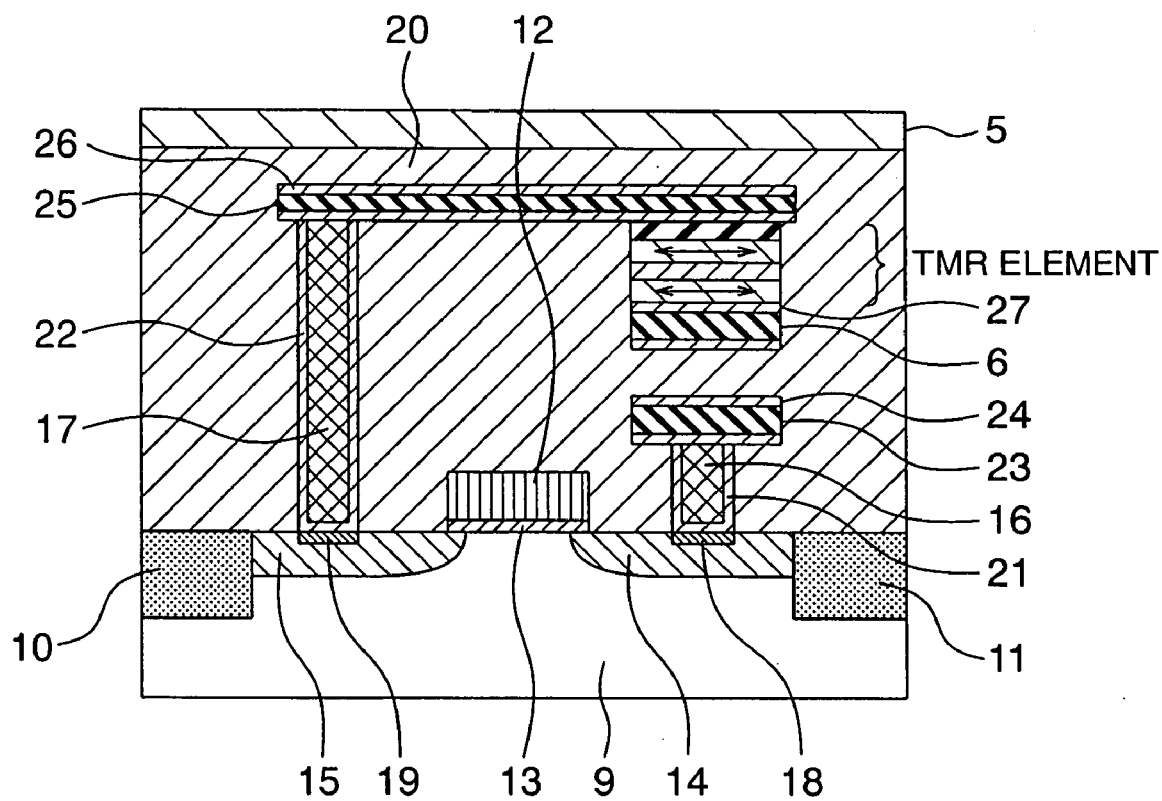
FIG. 18 is a cross-sectional view illustrating a memory cell of the MRAM in the second embodiment.

FIG. 16 illustrates the structure of an array in an MRAM according to a second embodiment of the present invention. Also, FIG. 17 is a cross-sectional view illustrating a TMR element and its surroundings, and FIG. 18 is a cross-sectional view illustrating a memory cell of the MRAM in which a tunnel current is read by a MOS transistor. In this embodiment, a barrier metal 27 made of TiN, TaN, $RuO_2$ or the like is disposed on a lower wiring layer 6 made of Ru, W, Ir, Os, Mo or the like deposited by sputtering, and the TMR element is disposed on the barrier metal 27. Also, an intermediate wiring layer 25 made of Al, Cu or the like is disposed on the TMR element, and connected to a contact plug 17. Note that the intermediate wiring layer 25 preferably has barrier metals 26 made of TiN, TaN, $RuO_2$ or the like on and below the intermediate wiring layer 25 in order to prevent the mutual diffusion and peeling on the interface. Also, an upper wiring layer 5 made of Al, Cu or the like is disposed above the intermediate wiring layer 25 across an interlayer insulating layer 20. While the upper wiring layer is in contact with the TMR element in the first embodiment, the second embodiment has such a structure that the lower wiring layer is in contact with the TMR element, so that the TMR and its surroundings are upside dow with respect to the first embodiment in the MRAM structure. Since the lattice constant of an underlying film is often reflected to the deposition of a multi-layer film, the MRAM structure of the second embodiment is preferred as compared with the structure of the first embodiment. Also, the spin-flip of the upper ferromagnetic layer in the TMR element is performed by applying currents to the upper and lower wiring layers, in a manner similar to the first embodiment.

THIRD EMBODIMENT

Figure 19:
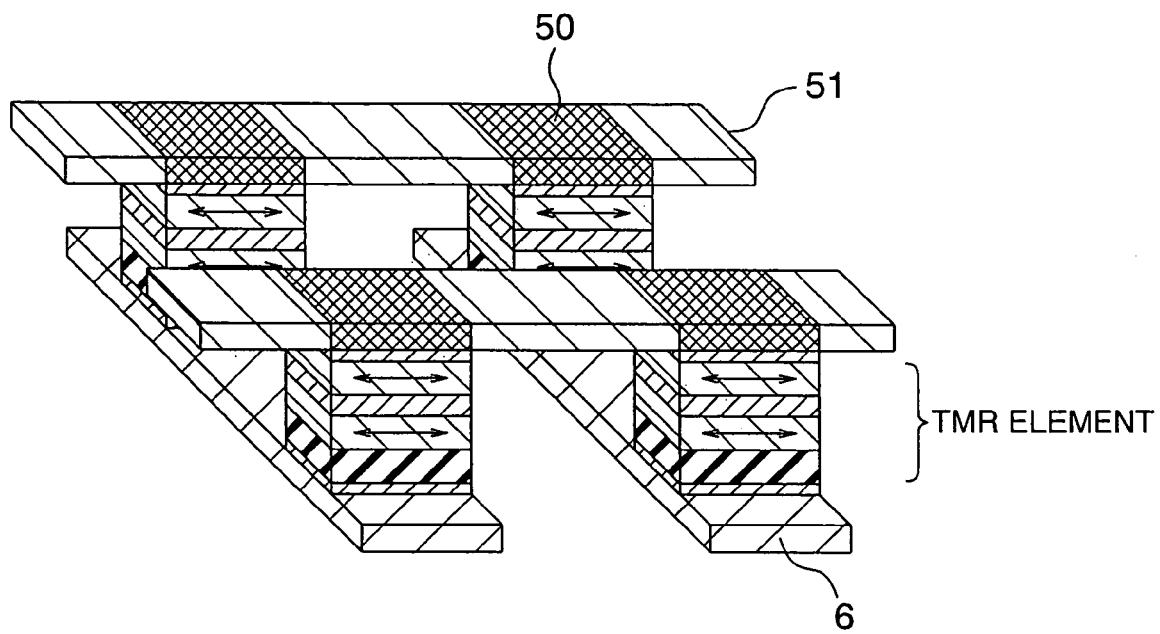
FIG. 19 is a perspective view illustrating the structure of an array in an MRAM according to a third embodiment.
Figure 20:
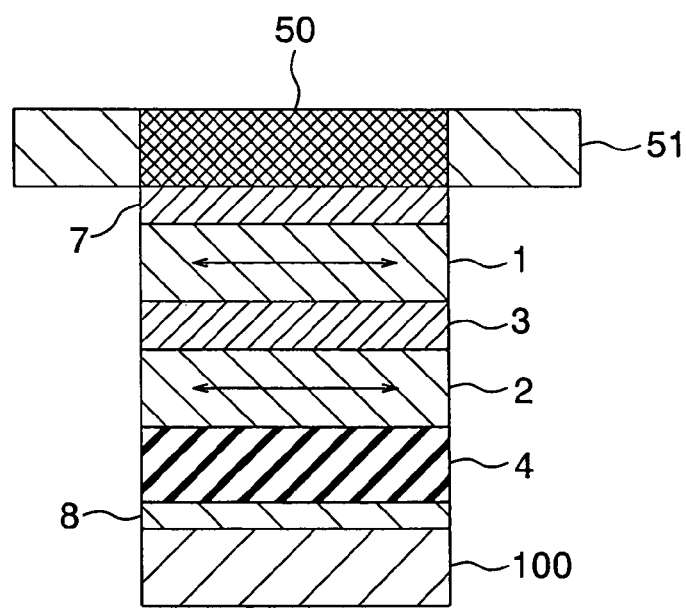
FIG. 20 is a cross-sectional view illustrating the TMR element and its surroundings of the MRAM in the third embodiment.
Figure 21:
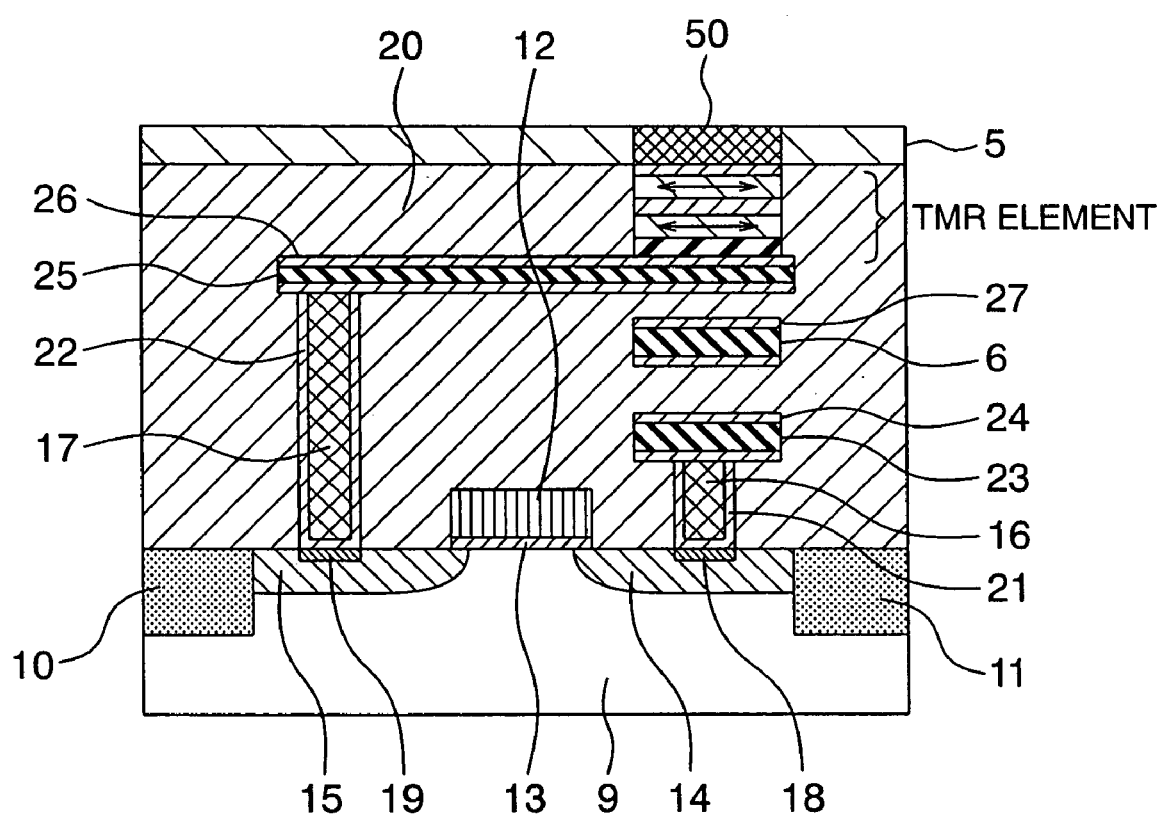
FIG. 21 is a cross-sectional view illustrating a memory cell of the MRAM in the third embodiment.

FIG. 19 illustrates the structure of an array in an MRAM according to a third embodiment of the present invention. Also, FIG. 20 is a cross-sectional view illustrating a TMR element and its surroundings, and FIG. 21 is a cross-sectional view illustrating a memory cell of the MRAM in which a tunnel current is read by a MOS transistor. In the first embodiment, the upper wiring layer is made of a material which has both of the interatomic distance on the close-packed plane and the Young's modulus larger than a material which constitutes the ferromagnetic layers in order to keep the ferromagnetic layers in tensile strain, but these materials Ru, W, Ir, Os, Mo and the like have larger electric resistances than conventional Al, and Cu which have been recently introduced as a wiring material for high-performance devices. Therefore, Ru, W, Ir, Os, Mo or the like may be used only in a strain applied region 50 in contact with the upper ferromagnetic layer 1, and Al, Cu or the like may be used in the remaining wiring region which is not in contact with the upper ferromagnetic layer 1. In this way, the resulting MRAM can be expected to exhibit higher speeds, lower power consumption, and higher reliability.

Figure 22:
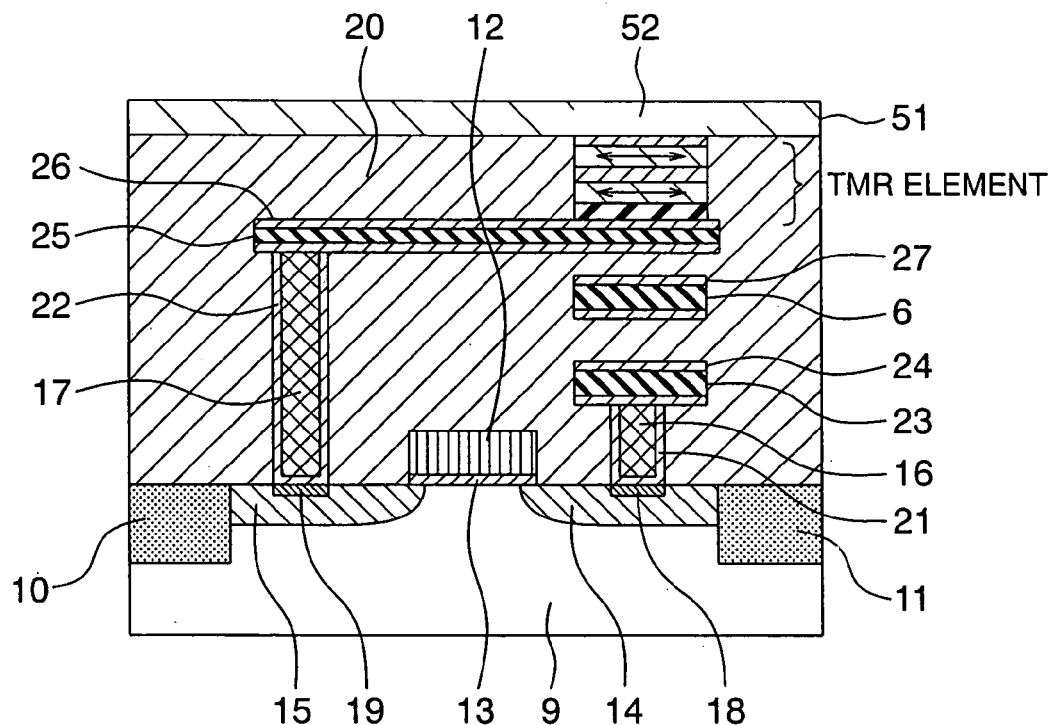
FIG. 22 is a diagram for describing a method of manufacturing the MRAM in the third embodiment.

For manufacturing the MRAM according to the third embodiment, the upper wiring layer 5 of the MRAM in the first embodiment, for example, is fabricated using Al, Cu or the like, and then a groove 52 is formed by etching for embedding the strain applied region 50 (FIG. 22). Subsequently, a film of Ru, W, Ir, Os, Mo or the like may further be deposited by sputtering and planarized.

Figure 23:
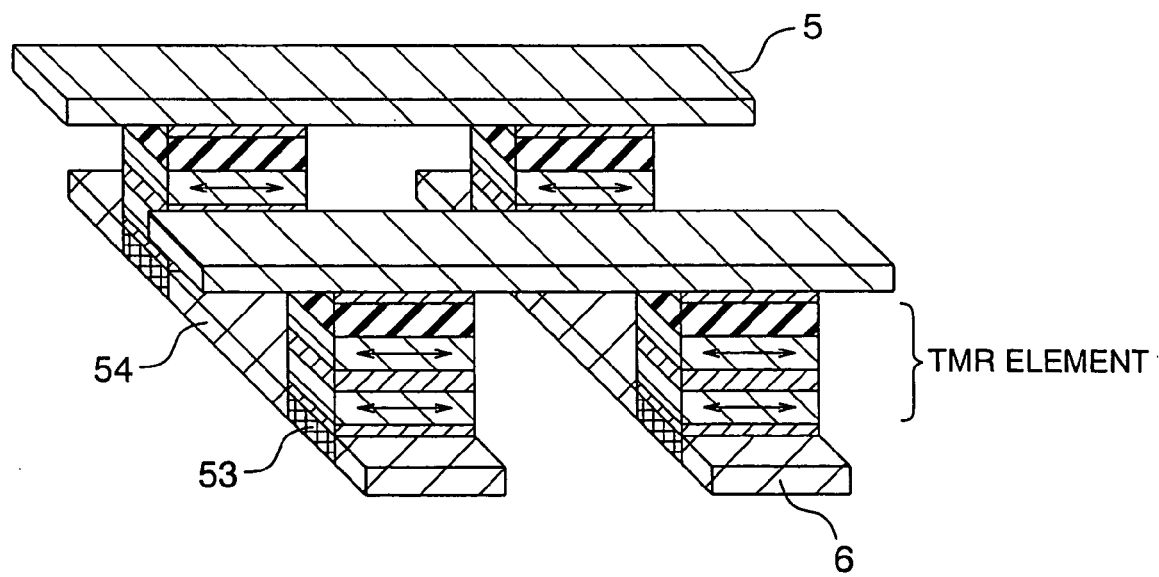
FIG. 23 is a perspective view illustrating the structure of the array in the MRAM in the third embodiment.

Also, in order to more effectively apply tensile strain to the ferromagnetic layer which forms part of the TMR element, the lower wiring layer in the second embodiment is more preferably comprised of the strain applied region 50, which is in contact with the lower ferromagnetic layer, and a wiring region 51, as illustrated in FIG. 23.

The present invention can be applied to memories for computers.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A magnetic memory using a TMR element in a memory layer, comprising:
    a ferromagnetic layer made of either Fe, Co or Ni and forming part of said TMR element in said memory layer, said ferromagnetic layer being kept in tensile strain; and
    a wiring layer adjacent to said ferromagnetic layer, said wiring layer including either Ru, W, Ir, Os or Mo.

2. A magnetic memory using a TMR element in a memory layer, and having said memory layer disposed at each intersection of upper and lower wiring layers, wherein:
    said TMR element in said memory element includes a ferromagnetic layer which is kept in tensile stain, said ferromagnetic material being made of a material including either Fe, Co or Ni, and
    each said wiring layer is made of a material including either Ru, W, Ir, Os or Mo in a portion adjacent to said ferromagnetic layer, and made of a material including either Al, Cu, Ag or Au in the remaining wiring portion.

* * * * *